(12) United States Patent  
Fukushima

(10) Patent No.: US 9,103,889 B1
(45) Date of Patent: Aug. 11, 2015

(54) SURFACE NMR COIL FOR THIN SAMPLES

(75) Inventor: Eiichi Fukushima, Albuquerque, NM (US)

(73) Assignee: ExxonMobil Upstream Research Company, Houston, TX (US)

( * ) Notice: Subject to any disclaimer, the term of this patent is extended or adjusted under 35 U.S.C. 154(b) by 503 days.

(21) Appl. No.: 13/536,719

(22) Filed: Jun. 28, 2012

Related U.S. Application Data

(60) Provisional application No. 61/571,440, filed on Jun. 28, 2011, provisional application No. 61/686,984, filed on Apr. 16, 2012.

(51) Int. Cl.
*G01V 3/00* (2006.01)
*G01R 33/3415* (2006.01)
*G01R 33/341* (2006.01)

(52) U.S. Cl.
CPC .......... *G01R 33/341* (2013.01); *G01R 33/3415* (2013.01)

(58) Field of Classification Search
CPC ..................................................... G01R 33/341
USPC .................. 324/318, 322, 303, 309, 307, 300
See application file for complete search history.

(56) References Cited

U.S. PATENT DOCUMENTS

| | | | |
|---|---|---|---|
| 6,326,787 B1 | 12/2001 | Cowgill | |
| 7,061,242 B2 * | 6/2006 | Ochi et al. | 324/318 |
| 7,397,246 B2 * | 7/2008 | Freytag et al. | 324/318 |
| 7,474,098 B2 * | 1/2009 | King | 324/318 |
| 7,579,833 B2 * | 8/2009 | Shorey et al. | 324/303 |
| 7,701,209 B1 * | 4/2010 | Green | 324/307 |
| 7,999,548 B1 * | 8/2011 | Brown et al. | 324/318 |

OTHER PUBLICATIONS

Ackerman, J. et al., "Mapping of Metabolites in Whole Animals by P NMR Using Surface Coils"; Nature, Jan. 10, 1980; pp. 167-170; vol. 283; Nature Publishing Group, London, UK.
Blümich, B., "The Incredible Shrinking Scanner"; Scientific American, Nov. 2008; pp. 92-98; Nature America, Inc., New York, USA.
Buess, M., "NQR Detection Using a Meanderline Surface Coil"; Journal of Magnetic Resonance, 1991; pp. 348-362; vol. 92; Elsevier B.V., New York, USA.
Del Federico, E. et al., "Unilateral NMR Applied to the Conservation of Works of Art"; Analytical and Bioanalytical Chemistry, Sep. 29, 2009; pp. 213-220; vol. 396; Springer-Verlag GmbH, Berlin, Germany.

(Continued)

*Primary Examiner* — Louis Arana
(74) *Attorney, Agent, or Firm* — ExxonMobil Upstream Research-Law Dept.

(57) ABSTRACT

There is disclosed a flat NMR (nuclear magnetic resonance) coil system especially adapted for evaluating thin samples of material(s), or samples in which a thin surface region of the sample is to be examined. The apparatus and method work well in a static magnetic field oriented generally perpendicular to the planes of the flat sample and coil. In one preferred mode, the coil is located approximately parallel to (and generally proximate to or in flush contact with) the surface of the subject sample, while the coil typically also is oriented so that the flux of the strong static field for performing the NMR is approximately normal to the planes of the coil and the sample surface. The coil has a wire path routed to define at least one continuous "figure eight" double loop arrangement, to improve operational performance of the complete coil.

26 Claims, 9 Drawing Sheets

(56) References Cited

OTHER PUBLICATIONS

Hoult, D., et al., "The Signal-to-Noise Ratio of the Nuclear Magnetic Resonance Experiment"; Journal of Magnetic Resonance, 1976; pp. 71-85; vol. 24; Academic Press, Inc., London, UK.

Lowe, I. et al., "A Fast Recovery Pulsed Nuclear Magnetic Resonance Sample Probe Using a Delay Line"; Review of Scientific Instruments, May 1974; pp. 631-639; vol. 45, No. 5; American Institute of Physics, Melville, NY, USA.

McDonald, P. et al., "A Unilateral NMR Magnet for Sub-structure Analysis in the Built Environment: The Surface GAR Field"; Journal of Magnetic Resonance, Nov. 22, 2006; pp. 1-11; vol. 185; Elsevier, Inc., New York, USA.

McDonald, P. et al., "Stray Field Magnetic Resonance Imaging"; Reports on Progress in Physics, 1998; pp. 1441-1493; vol. 61; IOP Publishing Ltd., London, UK.

Nakada, T. et al., "P NMR Spectroscopy of the Stomach by Zig-Zag Coil"; Magnetic Resonance in Medicine, 1987; pp. 449-455; vol. 5; Academic Press, Inc. (Elsevier), New York, USA.

Nielsen, N. et al., "A Flat-coil NMR Probe with Hydration Control of Oriented Phospholipid Bilayer Samples"; Journal of Biomolecular NMR, 1995; pp. 311-314; vol. 5, Issue 3; ESCOM Science Publishers, BV, Leiden, The Netherlands.

Roemer, P. et al., "The NMR Phased Array"; Magnetic Resonance in Medicine, 1990; pp. 192-225; vol. 16; Academic Press, Inc. (Elsevier), New York, USA.

Walsh, D., "Multi-channel Surface NMR Instrumentation and Software for 1D/2D Groundwater Investigations"; Journal of Applied Geophysics, 2008; pp. 140-150; vol. 66; Elsevier B.V., New York, USA.

\* cited by examiner

SURFACE NMR COIL FOR THIN SAMPLES

This application claims the benefit of the filing of U.S. Provisional Patent Application Ser. No. 61/571,440 filed 28 Jun. 2011, and of U.S. Provisional Patent Application Ser. No. 61/686,984 filed 16 Apr. 2012, and the specifications thereof are incorporated herein by reference.

BACKGROUND OF THE INVENTION

1. Field of the Invention

This invention is for a flat nuclear magnetic resonance coil, particularly a flat coil for examining thin samples of material(s), or for evaluating a thin region close to a surface of a sample. More specifically, the flat nuclear magnetic resonance coil according to this invention works well in a static magnetic field, for example Earth's magnetic field, that is oriented generally perpendicularly to the surface of the flat sample and plane of the coil.

2. Background Art

Nuclear magnetic resonance ("NMR") is a well-established technique with applications in fields such as physics, chemistry, mechanical engineering, chemical engineering, petroleum engineering, biology, and medicine. Most applications of NMR use strong static magnetic fields from magnets (a wide variety of types of magnets are employed in different systems, depending upon the system), functioning together with electrical current-carrying coils that generate time-varying magnetic fields at samples, to receive NMR signals from the samples that are induced by the time-varying magnetic fields. In this disclosure, "sample" refers to any object or material that is the intended subject of examination by NMR process. The strong static magnetic fields usually are generated by magnets that surround the sample. Examples include cylindrical horizontal superconducting magnets used for medical magnetic resonance imaging ("MRI"). In medical MRI, the current-carrying coils normally reside within the cylindrical superconducting magnet, and a patient is placed inside the specially designed coils (typified by the so-called "birdcage" coils). Other examples include vertical superconducting magnets used for chemical analysis, in which small sample-containing glass tubes are lowered into coils situated in the bore of the vertical superconducting magnets. Yet other examples include permanent magnets that do not require superconductors (which currently require cryogens). Permanent magnets usually have their sample spaces defined by steel poles, north and south, between which the samples in coils are placed. In a minority of examples, the sample is placed to one side of the magnet and coil to allow the examination of samples too large to fit inside the magnets. This class of single-sided or remote NMR experiments includes large-scale experiments in which the magnetic field of the Earth is used in lieu of artificial magnets, and in which some type of coil is spread out on the ground surface to detect signals from underground samples such as, for instance, water in aquifers.

The most critical parameter for NMR process is the signal-to-noise ratio, S/N. This ratio increases steeply in stronger magnetic fields; consequently there is a major push in the NMR field of endeavor to perform NMR experiments and evaluations in the strongest possible magnetic field. However, the cost, size, weight, and care required rises with both the strength of the magnetic field and the size of the region in which the magnetic field is generated. Thus, there is a critical need to attain the optimal S/N ratio at almost any field strength, but especially at the weaker magnetic field strengths that are, by necessity, used for the larger samples. The NMR coil represents the most critical component of the NMR apparatus for defining the maximum S/N available from a given sample.

Conventionally, the common NMR sample is not extremely "flat"—that is, its aspect ratio of any two orthogonal dimensions is fairly close to one. As examples, consider the human body for medical MRI, or a test tube-like geometry used in analytical chemistry, in which the large dimension generally is, at most, about ten times the small dimension. These aspect ratios are consistent with commonly used coil geometry, such as a solenoid with an aspect ratio close to unity. When the sample that requires inspection is flat, i.e., some of the aspect ratios being larger than, say, 100, the traditional coil geometries (such as a solenoid) are inefficient due to the mismatch between the geometries of the sample and the coil.

By way of further illustration, consider the sample to be a flat piece of paper and the coil available is a solenoid. Unless the paper can be rolled up, it will occupy an infinitesimal volume inside a hypothetical solenoid that is large enough to accommodate the extent of the paper. Another example is a case where signal is to be obtained from only a thin layer near the surface of an object such as the skin of an animal. Thus, there is a need for NMR coils that are tailored for flat high aspect ratio samples. This requirement is true for cases such as Earth's field NMR measurement of moisture content in soil at fairly shallow depths. The use of Earth's field avoids the need to use heavy and expensive magnets, but its relative weakness requires that a large amount of sample be examined. Thus, the geometry for such a situation is a flat coil that is large enough to generate a sufficient S/N ratio for practical use.

There are examples of prior art in which a coil has been designed to be sensitive to NMR signals from a relatively flat region of an object that was located to one side of the coil and experiencing a static magnetic field. In all such cases, and in contrast with the system and apparatus of the present disclosure, the sensitivity profile has not been uniform at a given distance from the coil; as an undesirable result, under examination a thin sample yielded much less than optimal signal-to-noise ratio S/N.

A loop of wire forming a "surface coil" used to obtain NMR signals from the neighborhood of the coil that is placed on the surface of a sample, as opposed to deep inside a three dimensional sample, has been proposed by Ackerman. J. J. H. Ackerman, et al., "Mapping of metabolites in whole animals by 31P NMR using surface coils," *Nature* 283, 167-170 (1980). When such a coil is placed close to the region of interest, the S/N ratio can be much better than a volume coil that is not tailored to the specific geometry. However, the simple loop of Ackerman et al. is not well-suited for use with a sample having a large aspect ratio (i.e., that which is much larger in horizontal extent compared to its thickness), because the sensitivity is not uniform in a plane close to the loop. Further, it does not work well in a static magnetic field that lies perpendicular to the plane of the coil—as opposed to the present invention, which works well in that orientation as well as parallel to the plane and to the wires simultaneously.

Array coils have been designed to receive NMR signals from a multitude of overlapping and closely positioned surface coils that can cover the region of interest, as described in P. B. Roemer, et al., "The NMR Phased Array," *Magn. Reson. Med.* 16, 192-225 (1990). Such coils are used in medical MRI, for example, to study the spine. An array of surface coils produces separate but overlapping data that are combined numerically to produce NMR signals. The aspect ratio (extent to depth) of the sampled space depends on the ratio of the overall size of the array to the size of the individual coil. Therefore, the number of coil elements, as well as the numerical complexity required, increases undesirably rapidly for large aspect ratios. And once again, the optimal static field direction is parallel to the plane of the coil array.

A "meanderline coil" is a surface coil with currents in an array of parallel wires with alternating directions; that is, the current flow in adjacent parallel wires is in opposite directions. Meanderline coils specifically designed for NMR of flat samples in biology have been described. T. Nakada, et al., "31P NMR Spectroscopy of the Stomach by Zig-Zag Coil," *Magn. Reson. Med.* 5, 449-455 (1987). They also have been utilized for studies of multiple-layer materials and coatings, where signals from a shallow sample region are desired without signals from the deeper regions of the sample that represent interference. Such a use of meander line coils is shown in, for example, U.S. Pat. No. 6,326,787 to Cowgill, the contents of which are incorporated herein by reference by way of useful background. These applications are useful in static magnetic fields that lie parallel to the wires (i.e., in a specific direction in the plane of the coil), but are not useful for static field components out of the plane of the coil. In the case, for example, of the Earth's field NMR, where the static field is mostly out of the plane of the coil, the component of the coil-generated magnetic field that is perpendicular to the static field is extremely non-uniform near the coil. The specific component oscillates in space because the current directions are opposite in adjacent wires. The resulting non-uniform sensitivity, at a given depth, makes the S/N quite poor for a sample close to the coil. And thin samples to be evaluated typically are placed close to the coil. (In contrast, the invention disclosed hereinafter will work well, not only with the field normal to the plane of the coil, but also for the case suited for meanderline, that is, with the coil wires parallel to the static field). The meander line coil has also been used in nuclear quadrupole resonance of solids, where the alternating direction of the currents in adjacent wires do not matter because there is no static magnetic field. M. L. Buess, et al., "NQR Detection Using a Meanderline Surface Coil," *J. Magn. Reson.* 92, 348-362 (1991). In sum, the meanderline type of coil does not work well for static magnetic fields that are situated substantially perpendicular to the plane of the coil, because the component of the RF field generated by the coil that is orthogonal to the static field is very non-uniform. This is especially true in regions that are halfway between adjacent wire segments, where the predominant component of the generated field is parallel to the static field.

Surface GARFIELD, as described by P. J. McDonald, et al., "A unilateral NMR magnet for sub-structure analysis in the built environment: The Surface GARField," *Journal of Magnetic Resonance*, 185, 1-11 (2007), is a NMR system containing a specialized magnet that is designed to obtain diffusion measurements, not NMR intensity measurements, in a thin region near the surface of a material. The special array coil is designed to work only with the specific arrangement of the permanent magnets that generate magnetic field gradients, and not with a uniform static magnetic field from an external magnet including the Earth's magnetic field.

A transmission line coil has been designed specifically to have an extremely low-Q for rapid recovery of the NMR system for the study of planar solids with very short spin-spin relaxation time T2. Lowe, I. J., and Engelsberg, M., "A fast recovery pulsed nuclear magnetic resonance sample probe using a delay line," *Review of Scientific Instruments* 45, 631-639 (1974). Similarly, there have been applications in membrane biology in which thin samples need to be examined, and for which specialized coils have been designed, such as those suggested in N. C. Nielsen, et al., "A flat-coil NMR probe with hydration control of oriented phospholipid bilayer samples," *Journal of Biomolecular NMR,* 5 (3), 311-314 (1995). In both of the immediately foregoing cases, the coil encloses the sample and, therefore, is not a surface coil that is suitable solely for separated thin samples (and not samples that are a part of a larger object).

STRAFI is the name of an NMR technique whereby the sample is placed in the stray magnetic field away from the center of the magnet, often even outside the magnet, and a very thin region is examined because of the steep magnetic field gradient that exists at the sample. STRAFI is described in P. J. McDonald and B. Newling, "Stray field magnetic resonance imaging," *Rep. Prog. Phys.* 61, 1441-1493 (1998). Because NMR "looks" for signals only at a certain frequency, i.e., the Larmor frequency, the steep magnetic field gradient insures that the signal arises from only a very thin region having the requisite Larmor frequency. In the STRAFI measurements, no special coil is used to optimize the S/N ratio. Instead, a solenoid is usually used to enclose a sample that is not especially flat, and a flat "slice" of the sample is rendered NMR-sensitive by the steep magnetic field gradient. Thus, the flat sample region accessible to STRAFI evaluation techniques is not due to any special coils, but rather to the way the static magnetic field is formed.

Against the foregoing background, the presently disclosed apparatus and method were developed. The present apparatus is of a coil that is tailored specifically to examine flat samples located to one side of the coil, and is especially suited to, but not limited to, single-sided NMR. The method of the presently disclosed invention is especially attractive because, as shall be described later herein, it performs well with a static magnetic field perpendicular to the plane of the coil.

SUMMARY OF THE INVENTION

The invention has to do with an apparatus and method for performing NMR analysis in a thin, substantially planar, sample situated in a static magnetic field, such as (but not necessarily) the magnetic field of the Earth, with field lines substantially normal to the plane of the thin sample. A variety of coil configurations are deployable proximate and generally parallel to a thin sample to perform NMR evaluation of the sample.

There is disclosed a coil having a body with a substantially flat geometry. In a preferred embodiment, a coil body has at least two finite lengths with substantially orthogonal components. The body functions as a single-sided NMR coil, that is, as a system: (a) for generating a magnetic field that is parallel to the plane of the coil and relatively uniform at a distance from the coil that is normal to the two finite lengths, and (b) for receiving induced signals from a time-varying magnetic field generated in the sample that is located to one side of the coil and where the afore-mentioned field is relatively uniform. The coil is wound with at least two, preferably many windings, such that most of the coil is constituted of a flat array having a plurality of parallel wire elements so connected that electrical currents flow in the same coordinate direction in all the parallel wire elements at any given time. The currents return via wires at the ends or sides of the body, in the same plane as the coil array, to minimize their effects on the coil array at the center of the body. In a preferred embodiment, the sensitive region is a thin, generally flat, region of the sample that is approximately the same size as the coil array, and parallel to the plane of the coil.

The depth of the sensitive region can be tuned in at least two ways. In a first mode, the spacing distances between the wire elements of the coil array is set to be approximately equal to the closest distance to the sensitive region. In a second mode, the output of the NMR device can be changed to adjust the distance to the maximally sensitive depth. Although the invention is applicable to the examination of thin flat samples of all kinds, it is especially well-suited for Earth's field NMR of flat samples, such as a shallow region of the Earth's subsurface whose moisture or pollutant content is to be evaluated.

An object and advantage of the presently disclosed apparatus and method are that the body's geometry matches that of the region of interest, resulting in uniform, and therefore efficient, NMR sensitivity that results in an optimal S/N ratio from the flat region of interest. In contrast, coils known in the art for flat sample regions do not present uniformly sensitive profiles that correspond to the region of interest and, thus, result in comparatively poor S/N ratios. This poor performance is typified by a conventional loop surface coil that has high sensitivity near the loop wire, but much lower sensitivity farther from the loop—such as towards the center of the loop, so that it is not ideally suited for region of interest that is closer to the coil than approximately a radius of the loop.

Another object and advantage of the disclosed method and apparatus are that the particular winding scheme is substantially immune to far-field magnetic interference, making it ideal for use in outdoor applications. In contrast, most of the prior art techniques described herein above lack this capability.

Yet other objects and advantages of the presently disclosed apparatus and method include the fact that, for very low frequency NMR such as Earth's field NMR, the optimal coil consists of a large number of turns of wire, thus reducing the need for a powerful amplifier to drive the coil. Other large-scale Earth's field NMR apparatus employ loops of wire that consist of a relatively small number of wires, and therefore lead to weaker S/N ratios.

Further objects and advantages of the invention will become apparent from a consideration of the drawings and ensuing written description.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

Like components are similarly labeled throughout the various views. The figures are not necessarily to scale, either in relation to each other or to an actual physical embodiment, but serve to illustrate generally the concepts of the invention.

DETAILED DESCRIPTION OF A PREFERRED EMBODIMENT

Disclosure of Best Mode(S)

There is disclosed hereby a flat NMR (nuclear magnetic resonance) coil system suitable for evaluating thin samples of material(s), or samples in which a thin region of the sample close to its surface needs to be examined. The coil apparatus and method work especially well in a static magnetic field that is generally oriented perpendicular to the plane of the flat sample and coil. The sample surface may be regarded to be generally flat and planar, and the coil body (while having a depth dimension) can be regarded as being contained within an imaginary plane. In a preferred mode for practicing the invention, the coil body is located approximately parallel to (and generally proximate to or in flush contact with) the surface of the subject sample; the apparatus typically but not essentially is oriented so that the flux of the strong static field for performing the NMR is approximately orthogonal (normal to) the planes of the coil and the sample surface. Nevertheless, the invention can also be practiced with a static magnetic field oriented in other directions, including parallel to the plane of the coil.

A "thin sample" may be a sample (or a layer of a sample) that in a selected dimension is no thicker than about 10% of its average extent in the other two (i.e., orthogonal) dimensions. The technology disclosed herein is suited for samples with more extreme form factors, for example, where the thickness of interest might be one percent (1%) of the sample's average extent in the other dimensions. Examples of such situations include measuring near-surface moisture over a wide area, examining thin sheet material, and looking for fluids on the far side of a solid barrier. It is, of course, also useful for samples that are not "thin," but for which useful information can be found in a layer at or near the surface, such as the surface of the ground, or the surface of an artificial component. When performing NMR examination of Earth's surface, i.e., in an upper layer of the ground, the plane of the coil apparatus may be located upon and/or parallel to the surface of the ground, and the static field to be harnessed may be the magnetic field of the Earth itself.

Figure 1:
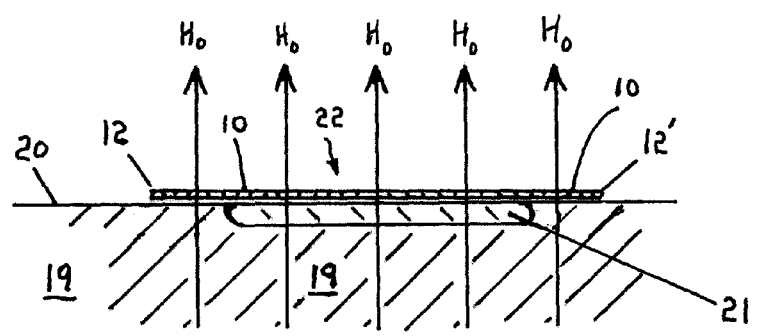
FIG. 1 is an end sectional view of a flat coil system according to the present invention, showing a coil body bearing a coil array disposed adjacent above the surface of a sample, and deployed to perform a NMR evaluation of a thin sensitive region immediately below the sample surface.

FIG. 1 is a simple side sectional view of how a basic embodiment of the apparatus including a flat coil assembly preferably is deployed according to the present disclosure. The coil assembly body 10 has thereon an electrically conductive pathway, such as a routed wire, arranged thereon to provide a coil 22 for generating magnetic field adjacent to the body 10. In this disclosure and in the claims, "wire" shall refer generally to any electrically conductive pathway, and includes conventional wires but also other known means of fabricating a pathway for the transmission of electric current. The current in the wire pathway ordinarily be controllably time-varied, according to known NMR techniques. It will be understood that the coil body 10 and coil 22 thereon may be any of a wide variety of sizes and materials, and the apparatus according to this invention can be miniaturized (if desired) using known fabrication techniques. The working coil 22 on the body 10 functions to generate a magnetic field for evaluating, via NMR processes, a sensitive region 21 within an upper portion of the sample material 19. The static field $H_0$ is depicted by the large upwardly directed directional arrows of FIG. 1, being generally perpendicular to the plane of the coil body 10. Wires returning current from the coil 22 to current sources and other electronics "off" the body 10 (FIG. 6A) and known in the NMR arts, preferably are placed at the sides of the body assembly, that is, concentrated in the same plane as the coil's working array, but near the edges 12, 12' of the body 10, as described in further detail herein after.

FIG. 1 thus illustrates, by way of example, a situation in which the flat coil body 10 according to this disclosure is laid on or very close to, and substantially parallel to, the sample surface 20 (e.g., the surface of the Earth) to measure, for example, the moisture content near the surface. The coil body 10 preferably is oriented so that the static field $H_0$ is geometrically substantially normal to the imaginary plane of the coil 22 (and thus, in use, of the sample surface 20). However, the apparatus is not exclusively so limited, and the invention may find utility with the plane of the coil 22 oriented substantially parallel to the static field $H_0$. For instance, where the static field is substantially parallel to the surface 20 of interest, the coil 22 can be placed "along" the static field with the parallel wire elements of the coil array generally parallel to the static field lines, i.e., in a north-south direction. Again, in a contemplated application of the present invention, the sample surface 20 is the surface of the Earth, and the static field $H_0$ is the Earth's magnetic field, harnessed to perform the NMR.

Figure 6C:
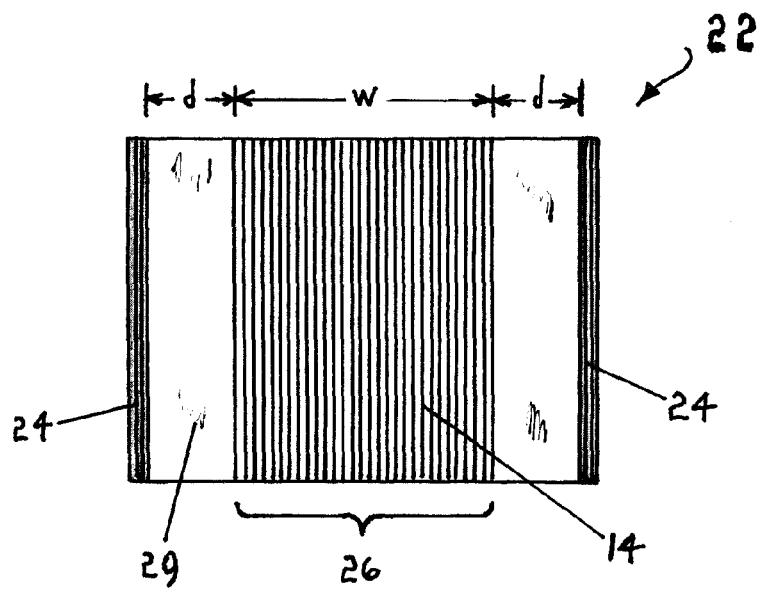
FIG. 6C is a top or plan view of an overall coil body and coil in accordance with the present invention, there being a large plurality of wire windings disposed upon a planar coil mounting body, and illustrating the central location upon the body of many parallel wire elements defining the working coil array, with the current return wire portions for the array all bundled at respective two sides of the body and remotely from the working array.
Figure 6A:
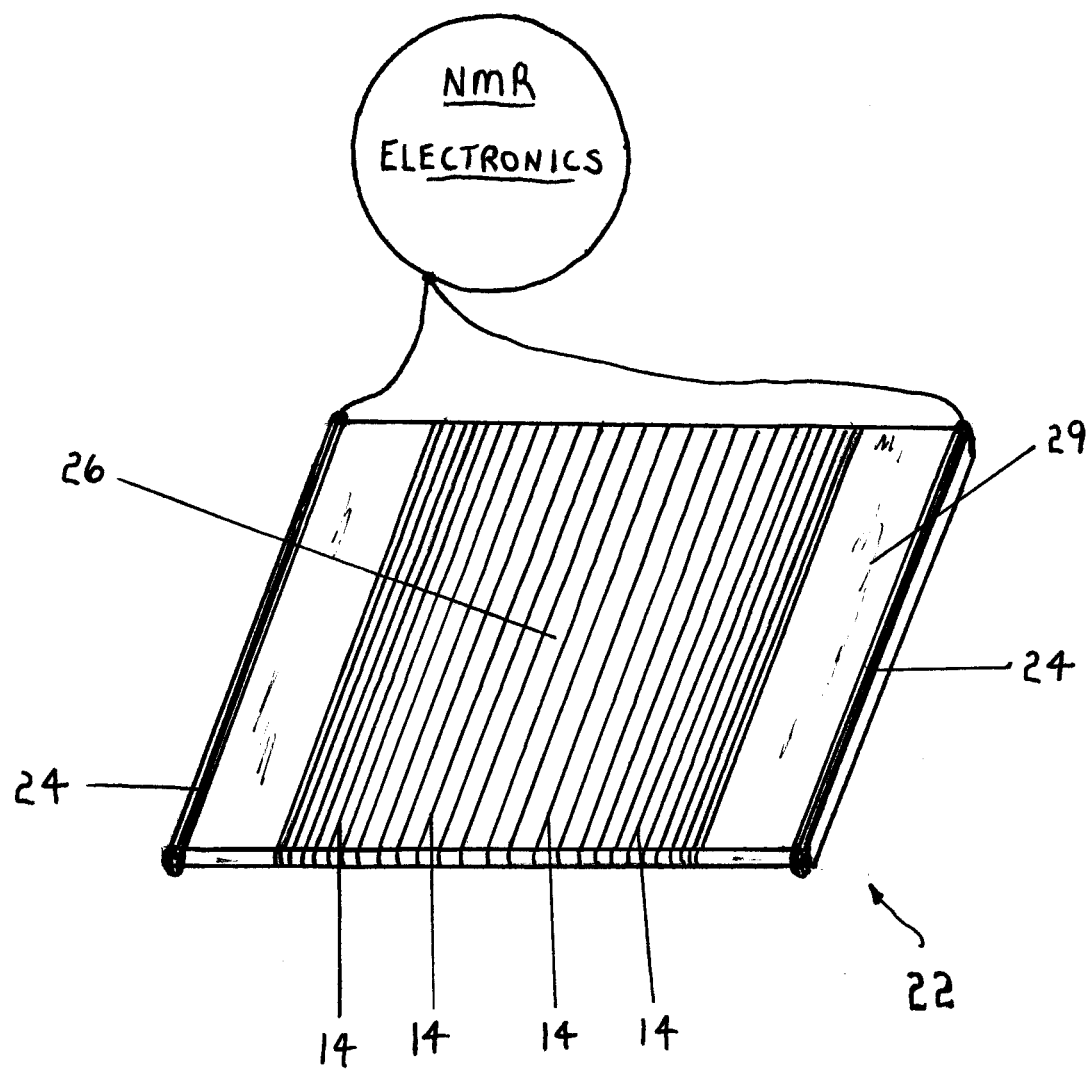
FIG. 6A is a perspective view of a portion of coil assembly according to the present disclosure in operative connection with other electronic components of a known nuclear magnetic resonance system, illustrating the wire windings of a coil array upon a substrate body, and with the spacing distance between adjacent ones of the array wire elements decreasing generally progressively towards the sides of the coil array.

The coil 22 on the body 10 is connectable to standard NMR circuit(s), as suggested by FIG. 6A In a preferred "tuned" embodiment, the coil 22 also is combined with a capacitor to form a resonant circuit, and the impedance matched to a transmitter and receiver through a transmit/receive switch. It may also be a part of a non-resonant circuit as a broadband probe that does not require tuning. Such matching and tuning circuits are generally known in the art.

As also is well-known in the art, the NMR signal arises from nuclear spins whose individual signals collectively produce measurable signals. Each spin needs to "see" two magnetic fields, a stationary "static field" that originates with a magnet (including Earth itself), and an oscillatory field created by the NMR coil. Presently disclosed is a specialized NMR coil 22 for creating the oscillating field needed to perform the nuclear magnetic resonance. The spins whose signals are coherently added without cancelling reside in uniform static magnetic fields, as well as reasonably uniform oscillatory fields that are substantially orthogonal to the static field. Accordingly, there is a premium on configuring NMR (and MRI) magnets that have fields as uniform as possible. This is also the motivation to make NMR coils with magnetic field profiles that match the region of interest, for example the a thin flat volume for the case indicated herein.

Typically, an NMR coil surrounds the sample to be evaluated. A smaller class of coils, often called "surface coils," evaluates a sample from one side only. A principal reason for having a coil only on one side of the sample is to obtain working access to a sample that cannot be surrounded by a coil (usually due to size), or to examine only a limited region that is close to the surface of the overall sample. Examples of such cases include MRI of fresco murals and other art objects (E. Del Federico, et al., "Unilateral NMR applied to the conservation of works of art," *Analytical and Bioanalytical Chemistry* 396, 213-222 (2010)), the NMR testing of automobile tires (B. Bluemich, "The Incredible Shrinking Scanner," *Sci. Am.* 299, 92-98 (2008)), and NMR detection of subsurface water from aboveground (D. O. Walsh, "Multichannel surface NMR instrumentation and software for 1 D/2D groundwater investigations," *Journal of Applied Geophysics* 66, 140-150 (2008)).

The commonly used surface coil, for example that discussed by Ackerman, in J. J. H. Ackerman, et al., "Mapping of metabolites in whole animals by 31P NMR using surface coils," *Nature* 283, 167-170 (1980), is a simple wire loop whose main magnetic field is perpendicular to the plane of the coil loop. Such type of surface coil is most frequently used with its plane parallel to the axial magnetic field of a superconducting solenoid, with its magnetic field arranged to be mostly orthogonal to the static field of the magnet to promote maximum sensitivity. Such loop coils have the characteristic that the volume that experiences relatively uniform magnetic field intensity is generally no closer than a loop radius away from the coil itself. This effect is due to the fact that the magnetic field decreases with distance from a current-carrying wire, so that in a loop the field is relatively uniform only at positions where relative distances to the wire(s) are similar. Consequently, a loop of wire is not optimal for NMR detection from parts of the sample that are much closer to the wire than a radius of the loop. In addition, the loop's axial magnetic field, being perpendicular to the plane of the loop, makes the loop less than optimal for use with its plane perpendicular to the static field—which is an orientation of optimum applicability of the present invention.

Figure 2A:
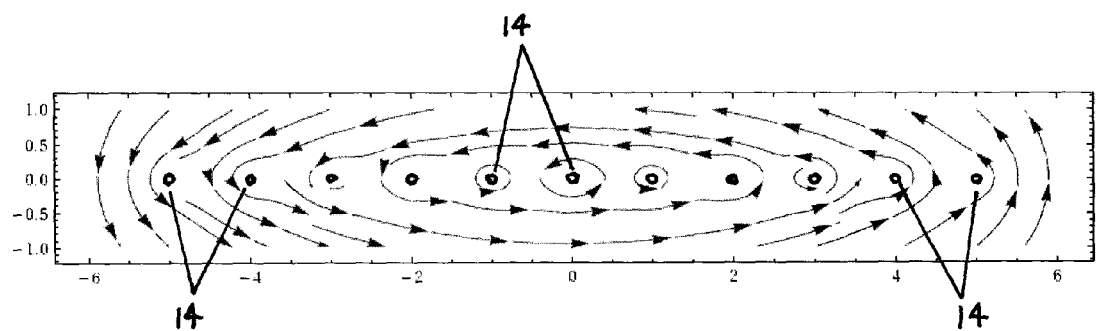
FIG. 2A is an end view diagram of several parallel wire elements as may be included in a coil array according to the present invention, showing magnetic field profiles across the array at a distance approximately equal to the spacing distance between wire elements.

Accordingly, an NMR coil apparatus preferred according to the present disclosure features a plurality of wire elements 14 that are generally parallel to each other, with the currents flowing in the same direction therein, as suggested by FIG. 2A. In FIG. 2A, the current in each wire element 14 flows out of the plane of the paper, to generate the magnetic field depicted by the directional arrows of the figure. The inter-element spacing preferably but not necessarily is approximately equal to or less than the distance (measured perpendicularly) from the coil array to the (approximately parallel) planar of region of interest 21 in the sample 19. Such a configuration is superior to known meanderline coils, because it is suitable for use in static fields $H_0$ that are perpendicular to the plane of the coil array, and the field generated at the region of interest is relatively uniform, promoting uniform sensitivity.

Figure 8:
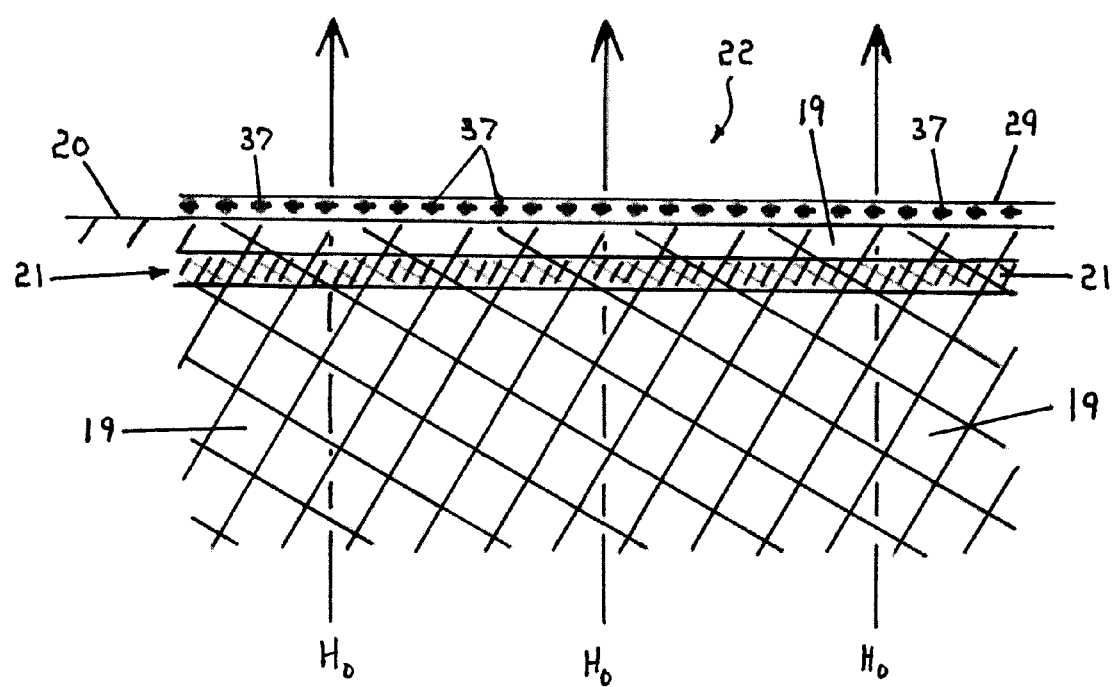
FIG. 8 is a side sectional view of a portion of a coil apparatus similar to FIG. 7, except that the parallel wire elements of the central coil array are grouped, and the groups of wire elements are uniformly spaced for the array to provide a sensitive region for NMR at a depth, the top of the sensitive region locate at a depth distance approximately equal to the separation between the element groups.

For example only, a square array of N>>1 evenly spaced wires such that the distance to the region of interest is approximately equal to the spacing. In FIG. 2A, N=11 and the gap between adjacent wire elements is, for example, one meter, so the entire coil array may be 10×10 meters. In this geometry, the magnetic field generated by each wire element 14 (eleven wire elements seen in FIG. 2A, six are labeled) is a circle around each element, close to the wire. (A wire element 14 is a discrete wire, or alternatively a grouped plurality of wires, as seen in FIG. 8.) At greater distances, the horizontal component of the generated field becomes increasingly uniform, while the vertical components of the field approach zero (except near the edges of the array). The field strength variations caused by the presence of discrete currents disappear for distances exceeding about one-half of the inter-element spacing, as indicated by FIG. 2A.

This reasoning holds for arrays of infinite size, but there are edge effects to contend with for real arrays that are finite size. One way to conceptualize an edge effect is to consider contributions to the field in a plane above the coil. There is a major contribution from the nearest wire (or nearest two wires if the point is halfway between two wired) as well as decreasing contributions from more distant wire elements. For a point above the plane of the coil but at the edge of the array, i.e., above the last parallel wire element, an entire half plane of wires elements, that otherwise would contribute to the field, is missing so that the net field at that point is significantly weaker than at points farther from the edge. The field strength drops off in the other direction, i.e., along the wires, for a similar reason. The drop-off in field perpendicular to the wire direction can be compensated for, if needed or desired, by either increasing the currents in the wire elements nearer the edges of the coil array, or by making the gaps between the wire elements smaller (e.g., progressively decreasing separation distances) towards the edges of the coil array (e.g., FIG. 6A). Similarly, the drop-off in the field parallel to the wire elements can be compensated by decreasing the distances of separation between adjacent elements towards the edges of the array.

Figure 2B:
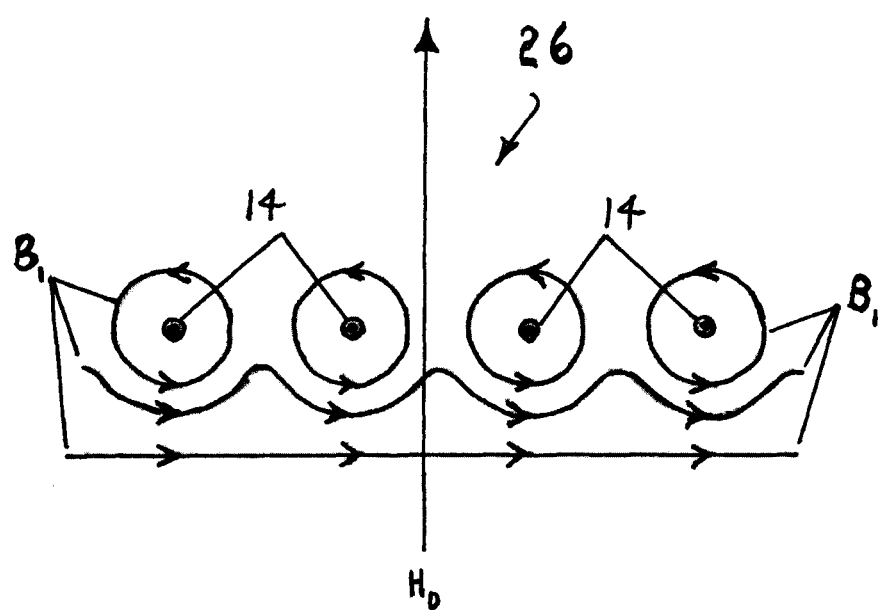
FIG. 2B is an end view, enlarged in relation to FIG. 2A, showing a four-wire-element portion of a coil array according to the present invention, and indicating how in the position shown the field generated thereby becomes approximately uniform at a distance below an imaginary plane containing the parallel wire elements, the field being directed perpendicularly to the axes of the wire elements and also generally normal to the static field.

Thus as provided in the present invention, an optimal coil geometry is an array of parallel wire elements having all their currents flowing in the same coordinate direction at any given time. Attention is invited to FIG. 2B, similar to an enlarged portion of FIG. 2A, showing how four generally straight, substantially parallel wire elements 14 in a portion of a coil array 26 generate RF fields $B_1$ proximate to the array that are substantially parallel to the plane of the coil, and simultaneously perpendicular to the wire elements 14. In FIG. 2B, the wire elements 14 are depicted in sectional end view, and the current in every wire is flowing "out" of the plane of the paper. A person skilled in the art readily appreciates that for the sake of illustrative simplicity only four wires elements 14 are shown in a portion of a coil array 26 in FIG. 2B; in practical coils according to the present invention, the number of parallel wire elements 14 may be vast, such as about one hundred or more, depending on the particular application. The wire elements 14 of a flat coil array 26 according to this disclosure preferably are disposed upon a coil body in electrical series, but alternatively may be connected in electrical parallel, also a matter of design choice depending upon the intended use.

In FIG. 2B, the directions of the generated magnetic field $B_1$ are suggested by the directional arrows associated with the field lines. Extremely close to each wire element 14, the field lines are concentric about the axis of the corresponding element. But, as suggested in the figure and in FIG. 2A, at a particular distance below/above the plane containing the coil array 26, the effective combined field generated by the overall array 26 approaches uniformity. The uniform portion of the generated field is seen to be generally perpendicular to the static field $H_0$.

This configuration for the flat coil array, in which the current in all parallel elements 14 of the array is flowing in the same direction at a particular point in time, differs significantly from a meanderline coil. Among other distinguishing aspects, the wire currents flowing all in the same direction generate, from the coil, a substantially uniform magnetic field at a distance from the coil approximately equal to, or exceeding, the separation distance between wire elements 14 (as suggested by the substantially straight field line at the bottom of FIG. 2B). In contrast, a meander line coil creates a magnetic field that is not uniform in intensity, or direction, at selected depths or distances from the plane of coil, and the field intensity decreases rapidly at distances exceeding the separation distance between wires. Accordingly, the instant invention greatly ameliorates the non-homogeneity of the array's RF excitation field $B_1$, which can be a serious problem for unilateral NMR. The flat coil 22 of this apparatus minimizes the inhomogeneity in planes parallel to the coil. The region of sensitivity 21, therefore, is characterized by a simple shape—a generally uniform region parallel to the plane of the coil 22, as indicated in FIG. 1.

The parallel wire elements 14 in an array 26 according to the invention can be connected in series or parallel. If in series as preferred, the system is electrically equivalent to a solenoidal coil, where the coil array corresponds to a portion of the solenoid that is made flat and the currents are constrained to be the same in each wire element. A parallel connection between wire elements results in smaller inductance and resistance, and the current distribution can be easily adjusted.

Figure 3:
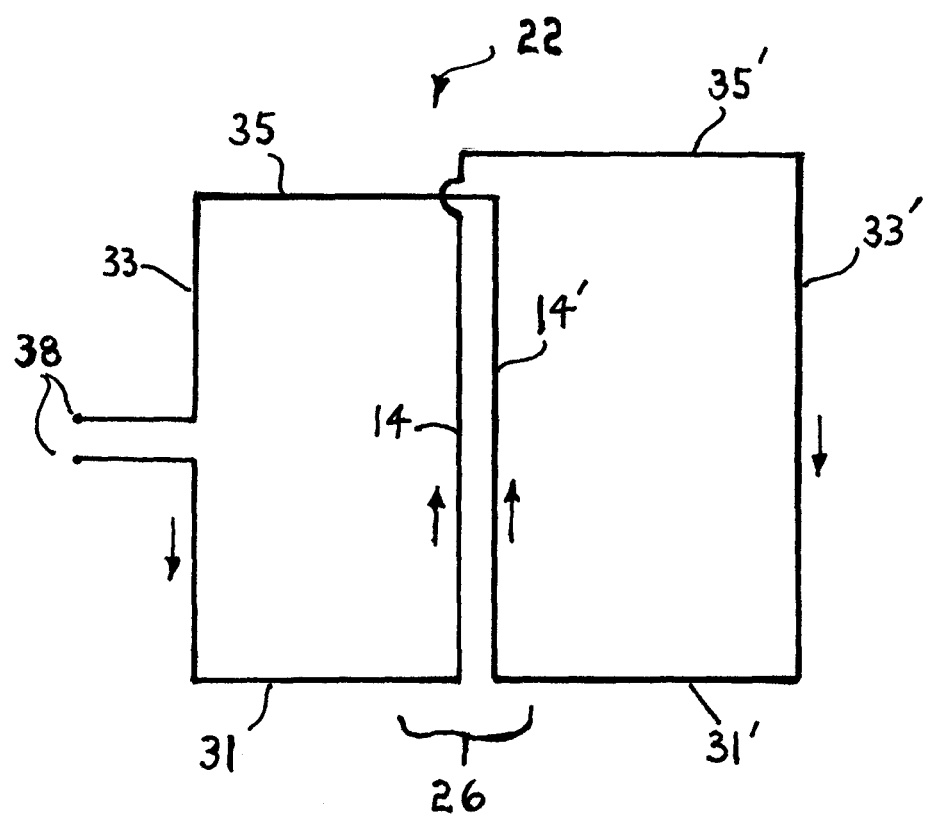
FIG. 3 diagrams schematically a simple embodiment of the coil apparatus according to the present invention, illustrating that the apparatus may employ a conductive path in a "figure-eight" coil arrangement, the wire thus routed to improve operational performance of the complete coil.

FIG. 3 illustrates diagrammatically, and by way only of non-limiting example, a very basic version of a flat coil 22 in accordance with the principles of the present disclosure. The coil 22 is comprised from a single wire, routed in accordance with the schematic of FIG. 3, which defines a central coil array 26, which coil array is itself defined by two parallel elements 14, 14' of the wire. The coil array 26 defines, therefore, a working portion of the coil 22, that is, a portion of the coil which generates, in a plane proximate and parallel to the plane of the coil, the desired uniform field. Those portions of the coil wire, besides the parallel wire elements 14, 14' defining the central array 26, such as the portions at the bottom lengths 31, 31', side lengths 33, 33', and top lengths 35, 35', function as current feeds and returns to and from the coil array 26. The leads 38 are the means by which the coil 22 is operatively connected to the balance of the NMR electronics system according to generally known principles. It is evident to those skilled in the art that the looped halves of the overall coil 22 can be made to circumscribe substantially equal areas. Accordingly and beneficially, the current induced in the complete coil 22 between the leads 38 by any magnetic interference signal from a remote (relative to the size of the coil) source is approximately zero, because the interference-induced current from each loop of the figure-eight double loop is equal and opposite. The induced interference current is essentially self-canceling.

In this disclosure, reference is made to the "figure eight" shape for a coil of the apparatus. "Figure eight" refers to the continuous route of the coil wire (or other electrically conductive path) in which the wire is passed over itself (without electrical connection at the point of passing) thereby to define a double loop. The expression is used in a general sense, in that the loops are not necessarily circular or even curvilinear, but rather may define a wide variety of shapes, including squares or rectangles of practically any shape or profile. Further, the coil wire may be passed over itself (without connection) more than once, to define a plurality of double loops relating in number to the number of times the wire is passed over itself. In the case of a single figure eight, for example as seen in the schematic of FIG. 3, a first one of the two loops is open because it is interrupted at the two ends (e.g., the leads 38) of the wire (to permit electrical communication with other system components), while the second loop is closed (in that the wire is uninterrupted through the length of the loop). In preferred embodiments of the apparatus, the coil wire is wound into a continuous series of figure eights, in which the wire is passed over itself (without connection) a plurality of times; in such a case of a plurality of figure eights (e.g., FIG. 4, showing two double loops), all the loops except a first one (having the coil connection contacts or leads 38) are closed, so that current flows without interruption throughout the entire length of the wire path constituting the multiple figure eights.

So, it is evident that the single wire, double loop, routing pattern seen in FIG. 3 can be serially repeated, so that in sophisticated embodiments the coil wire's plurality of circuitous windings define many double loops, and thus provide many more than just two parallel wire elements 14, 14' to define the central coil array 26. In such embodiments the number of coil windings like those seen in FIG. 3 may range up to, for example, about 100. Furthermore, each winding optionally may consist of multiple wires, each a part of a circuit according to the disclosure of FIG. 3. Each loop of each double loop includes an array element 14 portion, and an associated current return portion in which current flows in the opposite direction toward a corresponding terminal 38 or lead.

Figure 4:
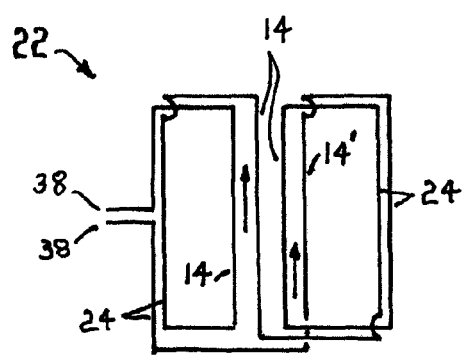
FIG. 4 is a schematic diagram similar to FIG. 3, illustrating that the number of windings in the coil arrangement may be increased according to the principle of the present invention, there being shown in FIG. 4 a plurality of windings in two figure eights having two double loops with four loops total, to provide four parallel wire elements in the central coil array.
Figure 5:
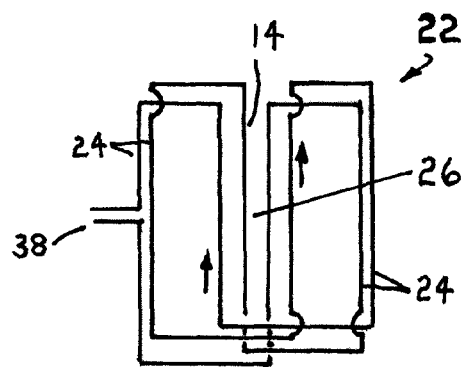
FIG. 5 is a schematic diagram similar to FIG. 4, illustrating an alternative wire routing scheme also defining a plurality of windings in two topological figure-eights to provide four parallel wire elements in the central coil array.

Further illustration of the foregoing is provided by combined reference to FIGS. 4 and 5, which show diagrammatically two possible ways to wind an electromagnetically equivalent flat coil 22 with four parallel wire elements comprising a central coil array 26. The coils 22 seen in FIGS. 4 and 5 are similar to the basic embodiment of FIG. 3, except that the number of circuit windings is doubled in relation to FIG. 3 so that there are twice as many parallel wire elements at the coil array 26. It is apparent, by inductive extension, that such flat coils 22 having the property to reject long-range magnetic interference can be designed and fabricated with practically any even number of parallel array wire elements 14, 14' in the coil array 26. In both the example embodiments of FIGS. 4 and 5, the coil array 26 includes parallel wire elements with equal currents that flow in the same direction at any given time. Thus, for example, in FIG. 4 the current flow in each of the four central parallel wire lengths is from the bottom to the top of the figure, as suggested by the directional arrows in FIG. 4. In both configurations, return wire portions 24 are located relatively remotely away from the array 26, such that the complete coil 22 forms a magnetically balanced circuit that cancels far-field magnetic interference. The two winding schemes seen in FIGS. 4 and 5 are equivalent in relevant characteristics, but it is noted that the coil 22 configuration of FIG. 4 requires less wire and is easier to construct compared to the coil 22 in FIG. 5. The difference in needed wire length becomes significant for larger coils with a large number of windings to provide a large number of parallel array wire elements 14 in the coil array 26.

FIGS. 4 and 5 are only example schematic diagrams of possible flat coil arrangements, topologically equivalent to doubled "figure-eights," to provide straight array wire elements 14, 14', plus (possibly bundled) return wire portions 24 off to the sides in the same plane. The figures show a two-turn figure-eight wire route, with four parallel array wire elements 14 in the center forming the working portion 26 of the flat coil. The portion of the coil 22 that generates the desirably uniform flux parallel to the coil plane thus is defined by the central section 26 having the array wire elements 14, 14' all carrying current in the same direction ("upward" in FIGS. 4 and 5).

The routing pattern seen in FIG. 4 or FIG. 5, however, can be multiplied many times with a single current path-wire, by multiplying the number of turns and looped "figure-eights." This may be accomplished by arranging a plurality of figure-eight loops upon and around a suitable planar substrate, with the multiplicity of windings still having a pair of accessible leads such as leads 38 seen in FIGS. 4 and 5. Careful consideration of FIGS. 3-5 shows that the wire of the coil 22 can be routed around a substrate (e.g. mount body 29 in FIG. 6A-C) so to provide a plurality of array wire elements 14 at a central portion of the substrate, with a corresponding number of return wire portions 24. The return wire portions 24 preferably are gathered and concentrated at sides of the substrate 29, away from the central portion. Sections of the wire bottom lengths 31, 31' and top lengths 35, 35' (as seen in FIG. 3) may be run, as needed, along portions of the top or bottom edges of the substrate body.

Attention is invited to FIG. 6A. The coil assembly including the coil 22 with central array 26 is in operative connection and communication with the other NMR electronics and components of a known nuclear magnetic resonance system or imaging suite, in manners known in the art. For a practical coil 22, many additional return wire portions 24 are required to return the current from the large plurality of generally parallel wire elements 14 of the central coil array 26. In a preferred embodiment of a coil assembly according to the present disclosure, the coil array 26 approximately defines a square comprised of numerous parallel elements 14 disposed upon a coil mount body 29. A coil mount body is optional, however, and versions of the coil 22 may be fabricated to be net-like in configuration, with flexible supporting lateral members to link and separate adjacent parallel elements. When used, the mount body 29 is fabricated from any suitable, substantially non-electrically-conductive and non-magnetic, material able to provide structural support and integrity to the overall flat coil assembly. Shown in FIGS. 6A and 6C to be generally rectangular, the mount body 29 may in alternative embodiments define other shapes and profiles. Current return is required regardless whether the array wire elements 14 in a coil array 26 are connected in series or parallel. The placement of the return wire portions 24 has a major effect on the efficiency of the coil 26.

Figure 6B:
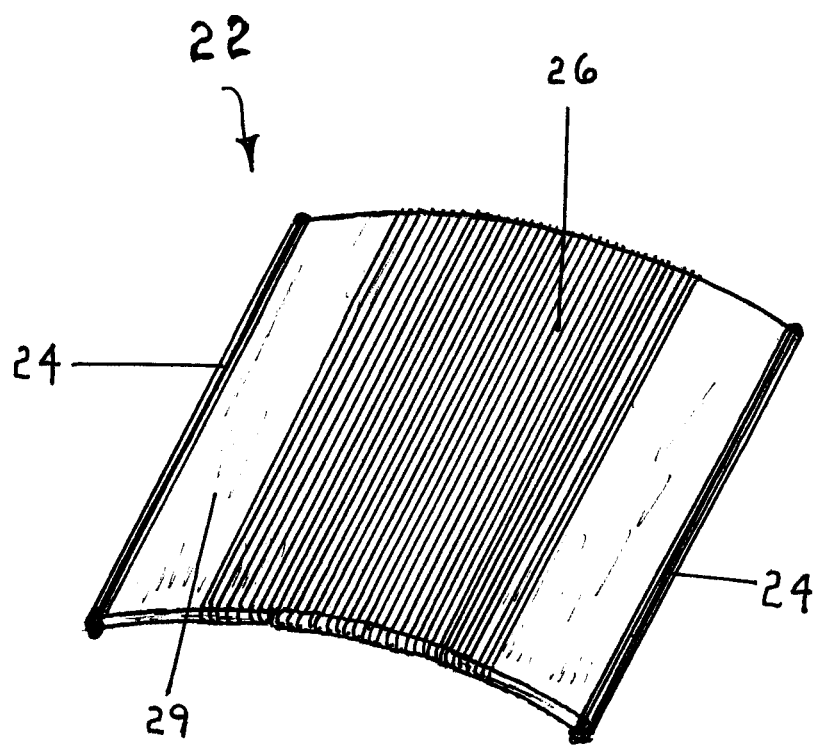
FIG. 6B is a perspective view of a portion of a coil assembly according to the present disclosure, illustrating a coil substrate body that has a mildly curved profile or which is flexible.

It should be apparent to a person skilled in the art that, while the coil 22 and substrate body 29 have been described herein above as being generally flat with a completely rectilinear substrate body, other shapes and profiles of the body and coil are within the scope of the invention. It may be desirable in alternative embodiments to adapt the shape of the coil 22 (and any substrate body) to complement or substantially correspond to the contour or profile of the surface of the sample under examination. For example, as seen in FIG. 6B, the coil 22 can be arranged to be curved in at least one dimension. When a substrate body 29 is used, as in FIG. 6B, the body may define the radius of curvature. The embodiment seen in FIG. 6B shows the coil that is curved in a dimension laterally perpendicular to the axes of the parallel array elements 14 making up the coil array 26. The radius of curvature may be selected to allow the coil to be placed substantially flush against a sample surface (e.g., a curved structural panel, the outside of a pipe or conduit, the face of a dam, etc.) having an approximately equal radius of curvature. It also is understood that the direction of such curvature alternatively could be in a direction parallel with the principle axes of the array 26, or it could be curved in both directions, e.g., a two-dimensional curve to define a concavo-convex, dome-like contour for the coil 22 and substrate body 29.

In a preferred embodiment, the current return wire portions 24 are situated upon the mount body 29 to be substantially co-planar with the coil array 26 of parallel wires. As indicated in FIG. 6C, the current return wire portions 24 preferably are removed from the margins of the coil array 26. Preferably, the return wire portions 24 are situated away from the edge of the array 26 and towards the edges of the body 29 by a return separation distance d that is at least twenty percent (20%) of the width dimension w of the coil array 26 of parallel wires. For a series wound coil, the return wire portions 24 preferably can be closely bundled together as shown in FIGS. 6A-C. It is also possible, however, to spatially distribute the return wire portions to alter their effects on the main array 26, or to generate NMR signals from them to add to the signals generated by the main coil array 26.

The substrate body 29 may be, but is not necessarily, fabricated from a substantially rigid material. In alternative embodiments, the substrate body may constitute a supple, flexible material to permit the overall profile of the coil 22 to be adapted to conform to an irregularly contoured surface under examination. For example, the substrate body 29 in selected alternative embodiments may be a pliable plastic sheet, whereby the substrate body and the coil mounted thereon can be laid upon the surface of (for instance) the ground, whereupon under the influence of gravity the body and coil array assume the general contour, which may be irregular and not smooth, of the surface upon which they are placed.

It also shall be apparent that the use of a substrate body may be optional. In certain embodiments of an apparatus in accordance with this disclosure, the parallel wire elements 14 defining the coil array 26 may be joined in spaced relation to each other by means of one or more flexible or rigid relatively narrow straps, cords, or brackets, disposed laterally across the array (not parallel with the array wire elements 14).

In FIGS. 6A-C, the current in each of the numerous array wire elements 14 comprising the coil array 26 flows in the same direction, i.e., the current in the array 26 is either all "down" or all "up" in FIGS. 6A-C at any given instant, but may be reversed at any other instant in time; the current flows in the opposite direction in the bundles of return wires 24. However, as can be determined from a consideration of FIGS. 4 and 5, at the central axis of the array 26 there is an imaginary line demarking the separation between the collected "left half" loops of the numerous plurality of figure-eight double loops, and the "right half" loops thereof (In FIG. 4, for example, there are two right-half loops and two left-half loops, there being windings for two figure-eight double loops. Again, the number of windings can be multiplied indefinitely to provide a numerous number of figure-eight double loops according to the disclosed scheme.) The electrical connections between the array wire elements 14 and the bundles 24 are "behind" the mount body 29 in FIGS. 6A-C.

It is understood, thus, that FIGS. 1, 2A, 2B, 7 and 8 offer information end sectional views, pertinent to portions of the embodiments of the coil 22 and/or coil array 26 seen in perspective in FIGS. 6A-C.

The placement of the return wire paths affects coil efficiency. The most readily apparent return path routing makes the connections as if the coil array 26, having the plurality of flat parallel wire elements 14, is part of a three-dimensional "prism." Thus, in the case of a series-connected coil array 26, the flat parallel wire elements are one part of a "solenoid," i.e., the coil can be thought of as a solenoid with one section flattened to produce the flat coil. But such an arrangement is inferior to routing the return wire portions 24 in the same plane as the coil array 26. Thus the preferred embodiment of this apparatus routes all the return wire portions 24 well away from the central, working array 26. This can be accomplished using variants of the "figure-8" shaped coil as disclosed with reference to FIGS. 3-5.

An additional advantage of the disclosed type of flat coil apparatus seen in FIG. 6C is that it is ideal for quadrature operation that will result in a $\sqrt{2}$ improvement of S/N ratio over a single coil. A single NMR coil is sensitive only to one component of the rotating field generated by the precessing nuclear spins; in contrast, two co-planar flat coils can be parallel stacked and oriented orthogonally (i.e. with perpendicular fields) to each other to form an NMR coil that can be operated in quadrature and be sensitive to rotating magnetic fields, that is, two components with a 90-degree phase shift between them. Such a quadrature operation results in increased efficiency for both transmission and reception. This is a known effect in NMR but not often used, for example, with the commonly used solenoids, due to geometrical constraints. The present methods and apparatus can take full advantage of quadrature transmission and detection because of the favorable geometry.

Figure 7:
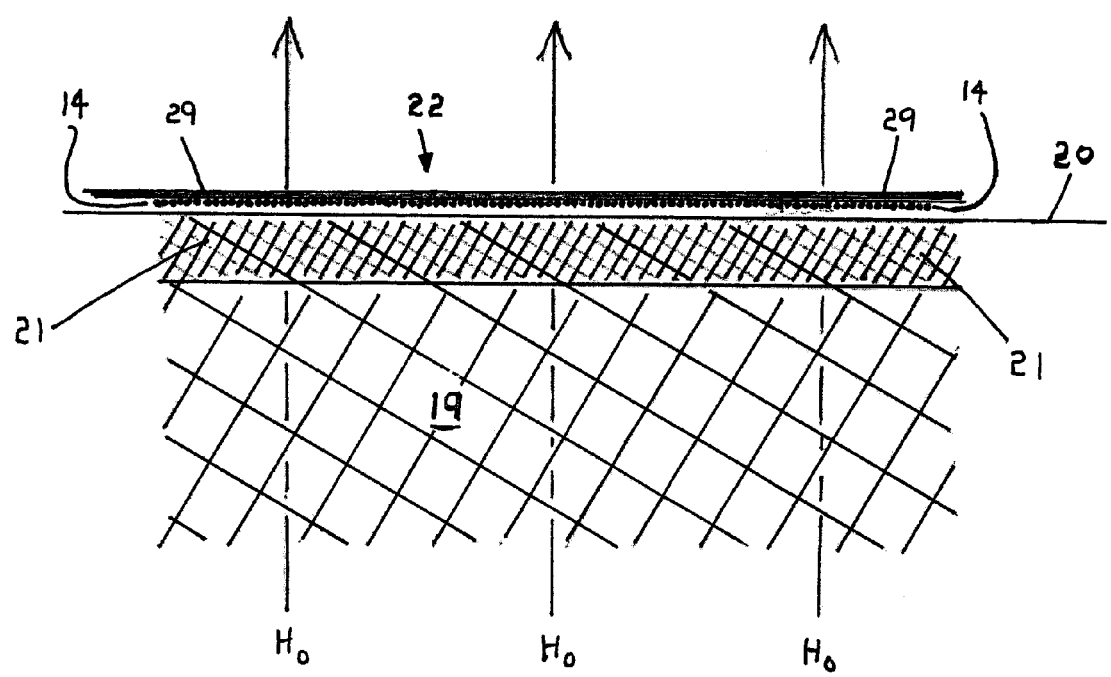
FIG. 7 is a side sectional view of a portion of a coil apparatus according to the present invention, the wire elements of the coil array being seen "end on," closely wound, and situated adjacently parallel to the surface of a sample under examination, illustrating how a series of uniformly densely spaced wire elements in the array may provide a sensitive region for NMR that begins very close to the coil.

Combined reference is made to FIGS. 6C, 7 and 8. The plurality of parallel array wire elements 14 defining the coil's 22 working coil array 26 may be spread out at uniform intervals on the mount body 29, or optionally may be bundled in groups, depending upon the depth profile of the sensitive region 21 that is desired for a particular sample 19 under examination. When the array wire elements 14 are uniformly very closely-wound (i.e., little or no separation between adjacent elements) or layered evenly, as indicated in FIG. 7, the sensitive region 21 begins at (immediately below) the flat coil 22 and culminates at a certain depth below the sample surface 20; the depth of the bottom of the region 21 depends on other, non-geometrical factors, but is determinable by the skilled artisan. (Multiple layers of parallel wire elements 14 in the coil array 26 may be beneficial, provided that the cumulative thickness of the layered array wire elements does not exceed the skin depth, as discussed further below). FIG. 8 shows a coil 22 on which the array wire elements are disposed in parallel groups 37; in FIG. 8, twenty-five bundles of, say, three wire elements per group 37 are shown beneath the mount body 29 and adjacent the sample surface 20. (However, a group 37 may consist of but a single array wire element 14, and adjacent elements be relatively widely spaced as suggested by FIG. 8). As a result, the sensitive region 21 of the embodiment of FIG. 8 begins at a selected depth distance below the coil 22 made in part from the groups 37, which distance is approximately equal to the separation distance between the groups 37, as suggested by FIG. 8.

As known in the art of magnetic resonance, the efficiency of a coil can be specified by a figure of merit that has the form $\mathcal{B}/\sqrt{r}$, where $\mathcal{B}$ is the magnetic field intensity generated at a specific location per unit current in the coil, and r is the resistance of the wire. D. I. Hoult and R. E. Richards, "The signal-to-noise ratio of the nuclear magnetic resonance experiment," *J. Magn. Reson.* 24, 71-85 (1976). Thus, it is readily understand that the more turns that are wound on the coil, the larger the figure of merit becomes, because both $\mathcal{B}$ and r are proportional to the number of turns N, so $\mathcal{B}/\sqrt{r}$ increases as $\sqrt{N}$ until the thickness of the entire winding becomes comparable to the skin depth of the conductor. For example, the skin depth of copper for Earth's field NMR (at approximately 2 kHz) is approximately 1.5 mm, so an optimal flat coil having a sensitive region adjacent to the coil may feature a close-wound multi-layer coil array of copper wires of total thickness of about 1.5 mm.

Thus, the spacing distances between adjacent wire elements of the coil array may be set to establish the perpendicular distance between the coil 22 and the "top" of the sensitive region 21. The separation distance between array elements 14, or in the embodiment of FIG. 8 between groups 37 of elements, is approximately equal to the shortest depth from the coil to the sensitive region.

In addition to accomplishing efficient NMR transmission and detection, the figure-eight geometry of the circuit of the presently described coil apparatus attenuates far-field magnetic interference, a critical benefit to any large coil application where it is inconvenient or impossible to shield against such interference. Thus, for a flat coil to be used especially outdoors, the relative magnetic fluxes in the two "halves" or loops of the coil circuit preferably are adjustable, either mechanically or electrically, in order to minimize the interference pickup that may vary according to nearby objects (such as magnetic rocks and electrical conductors that deflect the magnetic field). Mechanical adjustment refers to adjusting the wire positions, for example. Or a mechanical adjustment may be made using conductive plates 40, 42 of copper, aluminum, or other non-magnetic electrical conductor, that can steer the flux, as indicated in FIG. 9.

Figure 9:
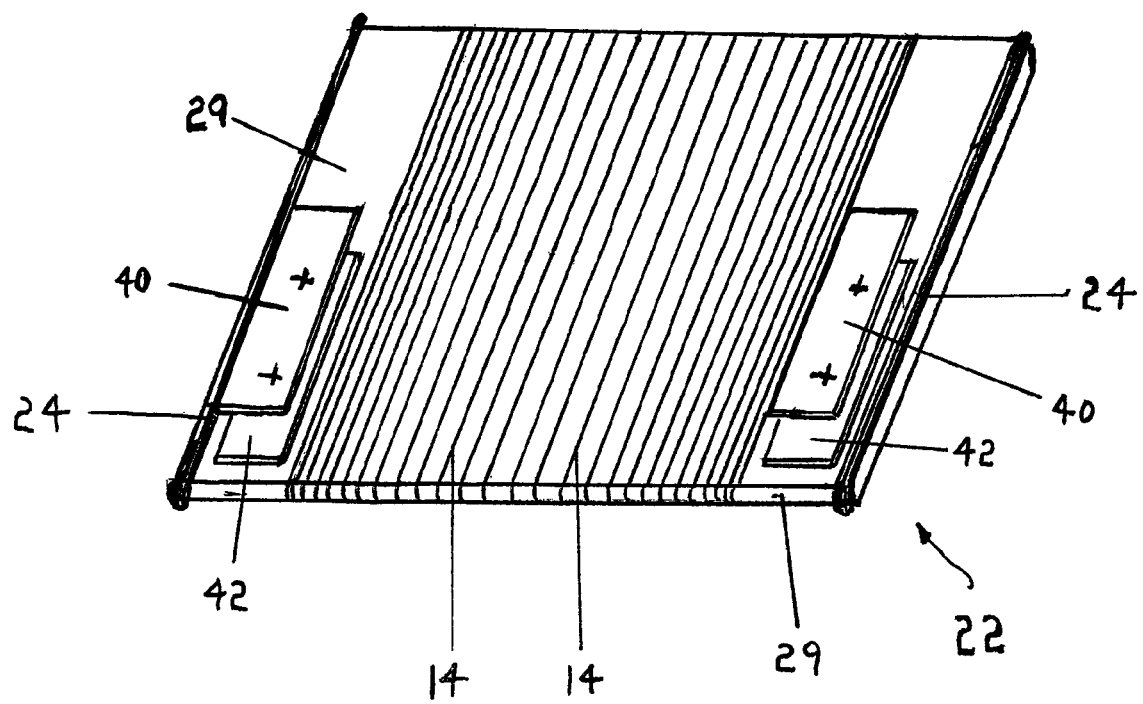
FIG. 9 is a perspective view of a coil assembly similar to that seen in FIG. 6A; showing the use of two pairs of parallel conductive plates in conductive contact with each other and mounted upon the substrate body, the plates of each pair being slidably movable in relation to each other to permit the adjustment of the magnetic fluxes through the two relative halves or loops of the coil circuit.

Referring to FIG. 9, an example of adjustable electrically conducting plates 40, 42 that may be manipulated to steer magnetic flux differentially in the two halves of the flat coil 22 is provided. A top plate 40 and a bottom plate 42 are in parallel flush contact, and upon the body 29 on both sides of the coil array 26 and between the coil array and the return wires 24. The conductor plates 40, 42 preferably have approximately the same size and shape, so that when stacked vertically they share about the same plan profile. The degree of overlap between the conductive plates is controllably variable from about 100% to nearly zero; in the latter case, the vertical plan area covered by the two plates is about twice the area of the two when vertically stacked. Each bottom plate 42 is attached to the substrate body 29. The top adjustable plate 40 is slidably mounted, by any suitable means (such as by pins-in-slots), in flush sliding contact upon the bottom plate 42, so as to permit the top plate to be controllably shifted (and then temporarily locked in place) in either or both of two dimensions in relation to the bottom plate. The controlled sliding movement of top plate 40 occurs while it remains in electrical contact with the bottom plate 42, so that the total conducting area between the plates can be adjusted. Thus, by sliding the top plate 40 upon the bottom plate 42, an operator can "steer" the coil flux. Preferably, one pair of such adjustable plates 40, 42 can be used on each side of the coil array 26, although it is also possible to use a single pair on the side of the array through which the larger flux passes. The area of overlap(s) between the plates 40, 42 may be controllably adjusted, according to principles generally known in the art, to minimize the magnetic interference.

Electric adjustment also includes active circuitry that balances the interference reception in the two halves or loops of the overall coil 22. The ability to attenuate undesirable interference makes the present flat coil apparatus 22 well-adapted for use in the proximity of, for example, high-current power lines.

There is disclosed, therefore, an apparatus for nuclear magnetic resonance examination of a thin sample 19 in a static magnetic field $H_0$. A basic version of the apparatus includes at least one coil 22 constituted from at least one wire path adapted to carry a controllable electric current, and routed to define at least one continuous figure eight double loop. Each loop in each double loop has or includes an array wire element 14 and a return wire portion 24. The array wire elements 14 in each loop are disposed substantially coplanar and substantially parallel. Further, the at least one double loop is arranged so that the current in all the array wire elements 14 flows in the same coordinate direction (at any given instant in time); accordingly, the array wire elements 14 define a coil array 26 for generating a magnetic field $B_1$, substantially uniform in direction and strength, generally parallel to an imaginary plane containing the coil array 26. When the sample 19 under examination is oriented so that the static field $H_0$ is normal to a plane of the sample, the at least one coil 22 is diposable proximately parallel to a plane of the sample (such as the sample's surface), so that the direction of the magnetic field $B_1$ generated by the coil 22 is substantially perpendicular to the static field $H_0$. The wire pathway has contact leads 38 or terminals with which to connect the wire pathway with other nuclear magnetic resonance electronics, according to concepts familiar in the art. In a preferred embodiment, the return wire portions 24 are located remotely from the coil array 26. The array wire elements 14 may be uniformly spaced, but more preferably adjacent array wire elements 14 proximate to the sides of the coil array 26 are spaced closer together than adjacent array wire elements proximate to the center of the coil array.

In one preferred embodiment of the coil 22, the coil array 26 has a width dimension and an edge, and the return wire portions 24 are located away from the edge of the coil array 26 by a return separation distance of at least twenty percent of the corresponding width dimension of the coil array 26. The coil 22 optionally but preferably is mounted upon a planar substrate body 29 having at least two sides, and the return wire portions 24 may bundled and located proximate to the peripheral sides of the substrate body 29. The array wire elements 14 are spaced upon the substrate body 29, so that current flowing therein creates an NMR sensitive region 21 beginning at the coil 22 and having a thickness. Alternatively, the array wire elements 14 may be disposed in parallel groups 37, the groups 37 being uniformly spaced upon the substrate body 29. A group 37 may consist of one, two, three, or more array wire elements 14, such that in groups having one array wire element, the separation distance between individual wire elements may be significant. Groups 37 of two or more array wire elements 14 can carry more current per group. In this embodiment, current flowing though the coil 22 creates an NMR sensitive region beginning at a distance from the coil and having a thickness.

This is a system for nuclear magnetic resonance examination of a thin substantially planar sample 19 in a static magnetic field $H_0$, comprising a coil 22 with an electrically continuous wire pathway for carrying a controllable electric current, and routed to define a plural series of figure eight double loops, with the at least one wire pathway terminating with contact leads 38 with which to connect the wire pathway with other nuclear magnetic resonance electronics, as seen in FIG. 6A. Each loop in each double loop features an array wire element 14 and a return wire portion 24, and the array wire element 14 and the return wire portion 24 are disposed to share a common imaginary plane. The array wire elements 14 in each loop also are substantially mutually coplanar and parallel.

Each double loop is arranged so that, at any given instant in time, the current in all the array wire elements 14 flows in the same coordinate direction, for example "up" in FIGS. 4 and 5, so that the array wire elements 14 define a coil array 26 for generating a magnetic field $B_1$ that is substantially uniform in direction and strength generally parallel to the imaginary plane containing the coil array and the return wires. Consequently, when the coil 22 is oriented so that the imaginary plane is substantially normal to the static field $H_0$, the coil 22 is locatable proximate and parallel to the plane of the sample 19 so that the direction of the magnetic field $B_1$ generated by the coil 22 is substantially perpendicular to the static field $H_0$. The return wire portions 24 preferably are located remotely from the coil array 26. Also, those adjacent array wire elements 14 proximate to sides of the coil array 26 preferably are spaced closer to each other than other adjacent array wire elements which are proximate to the center of the coil array 26, as indicated in FIG. 6A.

In this system, the substrate body 29 has at least two sides 12, 12', and the coil 22 is upon the substrate body with the return wire portions 24 being proximate to the sides of the substrate body. The substrate body 29 optionally may be made from a supple material, whereby the substrate body is flexibly conformable to a non-planar contour of a surface 20 of the sample 19.

Array wire elements 14 that are adjacent to each other are separated by a separation distance, and current flowing in adjacent array wire elements creates an NMR sensitive region 21 beginning at a depth distance from the adjacent array wire elements, the depth distance being approximately equal to the separation distance. In FIG. 7, the separation distance is nearly zero, so the depth distance also is nearly zero, with the sensitive region beginning immediately below the imaginary plane of the coil 22. Alternatively, the array wire elements 14 may be arranged in parallel groups 37 of at least one array wire element per group, with adjacent wire groups 37 being separated by a separation distance as seen in FIG. 8. Current flowing in adjacent groups 37 creates an NMR sensitive region 21 beginning at a depth distance from the adjacent wire groups, the depth distance being approximately equal to the separation distance between groups 37, as suggested in FIG. 8.

When the coil array 26 is located generally centrally upon the substrate body 29, as in FIG. 6A, the system optionally may include at least one, possibly two, pair of non-magnetic electrically conductive plates 40, 42 situated within at least one, possibly both, of the coil loops defined by one or more of the figure-eight double loops defined by the coil wire path. As seen in FIG. 9, the pair(s) of conductive plates 40, 42 are between respective return wire portion(s) 24 and the coil array 26. Each pair of plates 40, 42 features a bottom plate 42 attached to the substrate body 29 and a top plate 40 slidably disposed flush upon the bottom plate in constant electrical contact therewith. A user's controlled manipulation, by any suitable means, of the overlapped position of top plate 40 in relation to the bottom plate 42 adjusts magnetic flux differentially between the two loops of the coil 22.

While FIG. 1 illustrates a common positional relationship among the coil 22, the sample 19, and the static field $H_0$, the coil alternatively may be oriented so that the imaginary plane thereof is substantially parallel to the static field, with the coil 22 disposed proximate and parallel to the plane of the sample 19 (such as a flat surface 20), so that the direction of the uniform portion of the magnetic field $B_1$ generated by the coil 22 (as seen, e.g., in FIG. 2B) is substantially orthogonal to the static field $H_0$, but without the flux of the static field being normal to the plane of the coil 22.

Notable added features of the disclosed system and method include: It can be used so that the wires are parallel to the static magnetic field. It can be used in situations where the sample will be on both sides of the coil. It can be used on curved surfaces. It can be used for NQR (nuclear quadrapole resonance) applications.

Although the invention has been described in detail with particular reference to these preferred embodiments, other embodiments can achieve the same results. And while the present invention has been particularly illustrated and described with reference to exemplary embodiments thereof, it will be understood by those of ordinary skill in the art that various changes in form and details may be made therein without departing from the spirit and scope of the present invention as defined by the following claims. Therefore, it is to be understood that the above-described exemplary embodiments have been provided only in a descriptive sense and will not be construed as placing any limitation on the scope of the invention. Variations and modifications of the present invention will be obvious to those skilled in the art and it is intended to cover in the appended claims all such modifications and equivalents.

What is claimed is:

1. An apparatus for nuclear magnetic resonance examination of a thin sample in a static magnetic field, comprising at least one coil comprising at least one wire path adapted to carry a controllable electric current and routed to define a plurality of continuous figure eight double loops, wherein:
    each loop in each double loop comprises an array wire element and a return wire portion;
    the array wire elements in each loop are disposed substantially coplanar and substantially parallel;
    the plurality of double loops are arranged so that the current in all the array wire elements flows in the same coordinate direction whereby the array wire elements define a coil array for generating a magnetic field, substantially uniform in direction and strength, generally parallel to an imaginary plane containing the coil array; and
    when the sample is oriented so that the static field is normal to a plane of the sample, the at least one coil is disposable parallel to a plane of the sample so that the direction of the magnetic field generated by the coil is substantially perpendicular to the static field.

2. The apparatus of claim 1 wherein the at least one wire is a single wire having two lead ends.

3. The apparatus of claim 1 wherein the return wire portions are located remotely from the coil array.

4. The apparatus of claim 1 wherein the array wire elements are uniformly spaced.

5. The apparatus of claim 1 wherein adjacent array wire elements proximate to sides of the coil array are spaced closer together than adjacent array wire elements proximate to the center of the coil array.

6. The apparatus of claim 3 wherein the coil array has a width dimension and an edge, and the return wire portions are located away from the edge of the coil array by a return separation distance that is at least twenty percent (20%) of the width dimension of the coil array.

7. The apparatus of claim 3 wherein the coil is mounted upon a planar substrate body having at least two sides, and the return wire portions are bundled and located proximate to the sides of the substrate body.

8. The apparatus of claim 7 wherein the array wire elements are spaced upon the substrate body, wherein current flowing therein creates an NMR sensitive region beginning at the coil and having a thickness.

9. The apparatus of claim 7 wherein the array wire elements are disposed in parallel groups of at least one array wire element per group, the groups spaced upon the substrate body, wherein current flowing in the groups creates an NMR sensitive region beginning at a distance from the coil and having a thickness.

10. A system for nuclear magnetic resonance examination of a thin substantially planar sample in a static magnetic field, comprising a coil comprising an electrically continuous wire pathway for carrying a controllable electric current and routed to define a plural series of figure eight double loops, the at least one wire pathway comprising contact leads with which to connect the wire pathway with other nuclear magnetic resonance electronics, wherein:

each loop in each double loop comprises an array wire element and a return wire portion, the array wire element and the return wire portion disposed in a common imaginary plane;

the array wire elements in each loop are substantially mutually coplanar and parallel;

each double loop is arranged so that, at any given instant in time, the current in all the array wire elements flows in the same coordinate direction whereby the array wire elements define a coil array for generating a magnetic field substantially uniform in direction and strength generally parallel to the imaginary plane; and when the coil is oriented so that the imaginary plane is substantially normal to the static field, the coil is disposable proximate and parallel to the plane of the sample so that the direction of the magnetic field generated by the coil is substantially perpendicular to the static field.

11. The system of claim 10 wherein the return wire portions are located remotely from the coil array.

12. The system of claim 10 wherein adjacent array wire elements proximate to sides of the coil array are spaced closer together than adjacent array wire elements proximate to the center of the coil array.

13. The system of claim 10 further comprising a substrate body having at least two sides, the coil being mounted upon the substrate body and the return wire portions being proximate to the sides of the substrate body.

14. The system of claim 13 wherein the substrate body comprises a supple material, whereby the substrate body is flexibly conformable to a contour of a surface of the sample.

15. The system of claim 10 wherein adjacent array wire elements are separated by a separation distance, and wherein current flowing in adjacent array wire elements creates an NMR sensitive region beginning at a depth distance from the adjacent array wire elements, the depth distance being approximately equal to the separation distance.

16. The system of claim 10 wherein the array wire elements are disposed in parallel groups of at least one array wire element per group, adjacent wire groups being separated by a separation distance, and wherein current flowing in adjacent groups creates an NMR sensitive region beginning at a depth distance from the adjacent wire groups, the depth distance being approximately equal to the separation distance between groups.

17. The system of claim 13 wherein the coil array is located generally centrally upon the substrate body, and further comprising at least one pair of non-magnetic electrically conductive plates disposed within one of the coil loops and between return wire portions and the coil array, the at least one pair of plates comprising a bottom plate attached to the substrate body and a top plate slidably disposed flush upon the bottom plate in constant electrical contact therewith, whereby controlled manipulation of the top plate adjusts magnetic flux differentially between at least two loops of the coil.

18. The system of claim 17 wherein when the coil is oriented so that the imaginary plane is substantially parallel to the static field, the coil is disposable proximate and parallel to the plane of the sample so that the direction of the magnetic field generated by the coil is substantially orthogonal to the static field.

19. The apparatus of claim 9 wherein the parallel groups comprise two or more array wire elements per group.

20. The system of claim 16 wherein the parallel groups comprise two or more array wire elements per group.

21. The system of claim 17 further comprising two pairs of non-magnetic electrically conductive plates, each pair of plates disposed within one of the coil loops and between return wire portions and the coil array.

22. The apparatus of claim 1 wherein the coil comprises one hundred or more array wire elements.

23. The system of claim 10 wherein the coil comprises one hundred or more array wire elements.

24. The apparatus of claim 1 wherein the static field is the Earth's magnetic field.

25. The system of claim 10 wherein the static field is the Earth's magnetic field.

26. The apparatus of claim 1 wherein the array wire elements are connected in parallel.

* * * * *